United States Patent
Gupta et al.

(10) Patent No.: US 11,342,016 B2
(45) Date of Patent: *May 24, 2022

(54) READ CIRCUIT FOR MAGNETIC TUNNEL JUNCTION (MTJ) MEMORY

(71) Applicant: Taiwan Semiconductor Manufacturing Co., Ltd., Hsin-Chu (TW)

(72) Inventors: Gaurav Gupta, Hsinchu (TW); Zhiqiang Wu, Chubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/110,624

(22) Filed: Dec. 3, 2020

(65) Prior Publication Data

US 2021/0090631 A1    Mar. 25, 2021

Related U.S. Application Data

(63) Continuation of application No. 16/502,430, filed on Jul. 3, 2019, now Pat. No. 10,867,652.

(60) Provisional application No. 62/751,994, filed on Oct. 29, 2018.

(51) Int. Cl.

| | | |
|---|---|---|
| *G11C 11/00* | (2006.01) | |
| *G11C 11/16* | (2006.01) | |
| *H01L 27/22* | (2006.01) | |
| *H01L 43/02* | (2006.01) | |
| *H01L 43/10* | (2006.01) | |

(52) U.S. Cl.
CPC ........ *G11C 11/1673* (2013.01); *G11C 11/161* (2013.01); *G11C 11/1659* (2013.01); *H01L 27/228* (2013.01); *H01L 43/02* (2013.01); *G11C 11/1657* (2013.01); *H01L 43/10* (2013.01)

(58) Field of Classification Search
CPC .................................................. G11C 11/1673
USPC ......................................................... 365/158
See application file for complete search history.

(56) References Cited

U.S. PATENT DOCUMENTS

| | | | |
|---|---|---|---|
| 8,027,206 B2 | 9/2011 | Yoon et al. | |
| 9,455,011 B2 | 9/2016 | Raychowdhury et al. | |
| 10,867,652 B2* | 12/2020 | Gupta .................... | H01L 43/02 |
| 2004/0151024 A1 | 8/2004 | Fricke et al. | |

(Continued)

OTHER PUBLICATIONS

Wikipedia.org. "Negative Resistance." Published on Mar. 21, 2018.

(Continued)

*Primary Examiner* — Hoai V Ho
(74) *Attorney, Agent, or Firm* — Eschweiler & Potashnik, LLC

(57) ABSTRACT

In some embodiments, the present application provides a memory device. The memory device includes a first read bias transistor, a first pull-up read-enable transistor, an MTJ memory cell, a first pull-down read-enable transistor, and a first non-linear resistance device. The first non-linear resistance device is coupled in series and between the first pull-up read-enable transistor and the first read bias transistor. The first non-linear resistance device is configured to provide a first resistance when applied a first voltage and a second resistance greater than the first resistance when applied a second voltage smaller than the first voltage.

20 Claims, 9 Drawing Sheets

(56) References Cited

U.S. PATENT DOCUMENTS

| | | | |
|---|---|---|---|
| 2006/0104136 | A1 | 5/2006 | Gogl et al. |
| 2011/0194341 | A1 | 8/2011 | Gaidis et al. |
| 2014/0233294 | A1 | 8/2014 | Ting et al. |
| 2015/0070978 | A1 | 3/2015 | Kim et al. |
| 2018/0350418 | A1 | 12/2018 | Doyle et al. |
| 2020/0005846 | A1 | 1/2020 | Liu et al. |

OTHER PUBLICATIONS

Circuits Today. "SCR-Volt-Ampere-Characteristics." The date of publication is unknown. Retrieved online on Mar. 21, 2018 from https://www.circuitstoday.com/scr-characteristics.

Circuits Today. "Triac Characteristics." The date of publication is unknown. Retrieved online on Mar. 21, 2018 from https://www.circuitstoday.com/triac-characteristics.

Solo-Labs. "Diodes—Types and Applications." Published on Feb. 26, 2014.

Tutor Circle. "Zener Diode." The date of publication is unknown. Retrieved online on Dec. 6, 2018 from http://physics.tutorcircle.com/electricity-and-magnetism/zener-diode.html.

Khvalkovskiy et al. "Erratum: Basic Principles of STT-MRAM Cell Operation in Memory Arrays." J. Phys. D: Appl. Phys. 46 (2013) 139601 (1pp), published on Feb. 28, 2013.

DeBrosse et al. "A 16Mb MRAM Featuring Bootstrapped Write Drivers." IEEE 2004 Symposium on VLSI Circuits Digest of Technical Papers, published on Apr. 25, 2005.

Ren et al. "A Body-Voltage-Sensing-Based Short Pulse Reading Circuit for Spin-Torque Transfer RAMs (STT-RAMs)." IEEE 13th Int'l Symposium on Quality Electronic Design, published on Apr. 19, 2012.

Wang et al. "Tunneling Negative Differential Resistance-Assisted STT-RAM for Efficient Read and Write Operations." IEEE Transactions on Electron Devices, vol. 64, No. 1, Jan. 2017, published on Dec. 6, 2016.

Wang et al. "Leveraging nMOS Negative Differential Resistance for Low Power, High Reliability Magnetic Memory." IEEE Transactions on Electron Devices, vol. 64, No. 10, Oct. 2017, published on Sep. 1, 2017.

Umeki et al. "A Negative-Resistance Sense Amplifier for Low-Voltage Operating STT-MRAM." IEEE 20th Asia and South Pacific Design Automation Conference, published on Mar. 12, 2015.

Halupka et al. "Negative-Resistance Read and Write Schemes for STT-MRAM in 0.13μm CMOS." 2010 IEEE International Solid-State Circuits Conference, published on Mar. 18, 2010.

Yumeki et al. "Negative-Resistance Read and Write Schemes for STT-MRAM in 0.13μm CMOS. Negative-Resistance Read and Write Schemes for STT-MRAM in 0.13μm CMOS." IEICE Trans. Fundamentals, vol. E97-A, No. 12, published Dec. 2014.

Fong et al. "Spin-Transfer Torque Memories: Devices, Circuits, and Systems." Proceedings of the IEEE vol. 104, No. 7, Jul. 2016, published on Apr. 7, 2016.

Non-Final Office Action dated Apr. 20, 2020 for U.S. Appl. No. 16/502,430.

Notice of Allowance dated Aug. 24, 2020 for U.S. Appl. No. 16/502,430.

\* cited by examiner

READ CIRCUIT FOR MAGNETIC TUNNEL JUNCTION (MTJ) MEMORY

REFERENCE TO RELATED APPLICATIONS

This Application is a Continuation of U.S. application Ser. No. 16/502,430, filed on Jul. 3, 2019, which claims the benefit of U.S. Provisional Application No. 62/751,994, filed on Oct. 29, 2018. The contents of the above-referenced Patent Applications are hereby incorporated by reference in their entirety.

BACKGROUND

Many modern-day electronic devices contain various kinds of random access memories. A random access memory (RAM) may be a volatile memory where the stored data is lost in the absence of power or a non-volatile memory which stores data in the absence of power. Resistive or magnetic memory devices including tunnel junctions (MTJs) can be used in RAMs, and are promising candidates for next-generation memory solutions due to simple structures and their compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
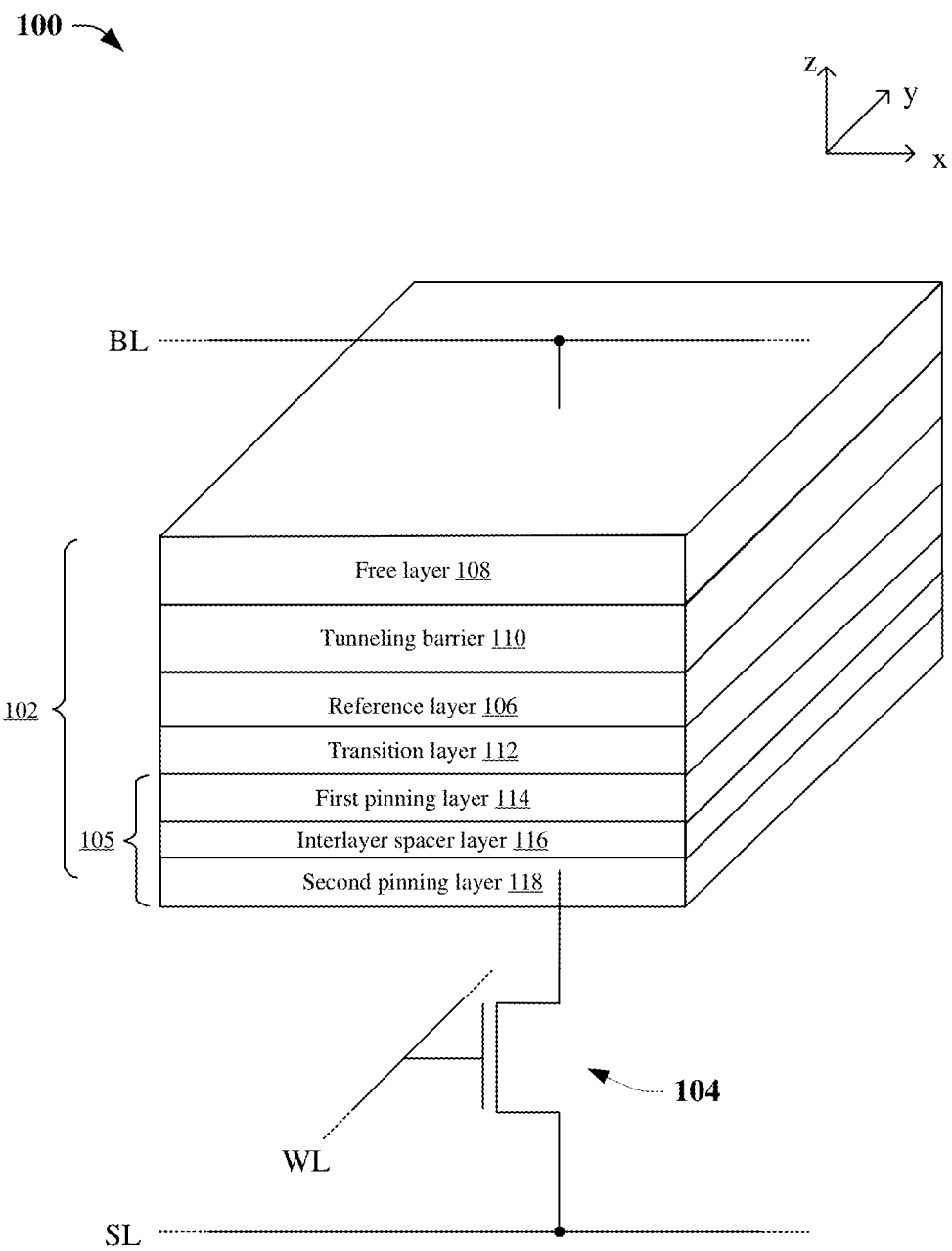
FIG. 1 illustrates a three-dimensional view of some embodiments of MTJ memory cell.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

A magnetic tunnel junction (MTJ) includes first and second ferromagnetic films separated by a tunnel barrier layer. One of the ferromagnetic films (often referred to as a "reference layer") has a fixed magnetization direction, while the other ferromagnetic film (often referred to as a "free layer") has a variable magnetization direction. For MTJs with positive tunneling magnetoresistance (TMR), if the magnetization directions of the reference layer and free layer are in a parallel orientation, electrons will more likely tunnel through the tunnel barrier layer, such that the MTJ is in a low-resistance state. Conversely, if the magnetization directions of the reference layer and free layer are in an anti-parallel orientation, electrons will less likely tunnel through the tunnel barrier layer, such that the MTJ is in a high-resistance state. Consequently, the MTJ can be switched between two states of electrical resistance, a first state with a low resistance ($R_P$: magnetization directions of the reference layer and the free layer are parallel) and a second state with a high resistance ($R_{AP}$: magnetization directions of the reference layer and the free layer are anti-parallel). It is noted that MTJs can also have a negative TMR, e.g., lower resistance for anti-parallel orientation and higher resistance for parallel orientation, and though the following description is written in the context of positive TMR based MTJs, it will be appreciated the present disclosure is also applicable to MTJs with a negative TMR.

Because of their binary nature, MTJs are used in memory cells to store digital data, with the low resistance state $R_P$ corresponding to a first data state (e.g., logical "0"), and the high-resistance state $R_{AP}$ corresponding to a second data state (e.g., logical "1"). To read data from such an MTJ memory cell, the MTJ's resistance $R_{MTJ}$ (which can vary between $R_P$ and $R_{AP}$, depending on the data state that is stored) can be compared to a reference cell's resistance, $R_{Ref}$ (where $R_{Ref}$, for example, is designed to be in between $R_P$ and $R_{AP}$, for instance, an average). In some techniques, a given read voltage $V_{Read}$ is applied to the MTJ memory cell and the reference cell. This read voltage results in a read current flowing through the MTJ ($I_{MTJ}$) and a reference current flowing through the reference cell ($I_{Ref}$). If the MTJ is in a parallel state, the read current $I_{MTJ}$ has a first value ($I_{MTJ-P}$) greater than $I_{Ref}$; while if the MTJ is in an antiparallel state, the read current $I_{MTJ}$ has a second value ($I_{MTJ-AP}$) that is less than $I_{Ref}$. Thus, during a read operation, if $I_{MTJ}$ is greater than $I_{Ref}$, then a first digital value (e.g., "0") is read from the MTJ cell. On the other hand, if $I_{MTJ}$ is less than $I_{Ref}$ for the read operation, then a second digital value (e.g., "1") is read from the MTJ cell.

However, MTJ read operation may sometimes also flip or significantly change, and the corresponding probability is called Read Disturb Rate (RDR). RDR, in turn, depends on the magnitude of the current passed through the MTJ ($I_{MTJ}$) and the duration for which it is passed. Although a large read current would provide good signal separation between $R_P$ and $R_{AP}$, a large read current may inadvertently overwrite the free layer in the MTJ. Also, a writing current may also be increased as a result of the large read current. A large writing current would introduce more energy dissipation in the write operation, and also may contribute to the chances of MTJ breakdown. Conversely, though a small read current would be less likely to overwrite the free layer, a small read current may provide poor signal separation between $R_P$ and $R_{AP}$. As the size of the MTJ is scaled down, the resistance of the MTJ increases and exacerbates these read operation issues. The magnitude of the current passed through the MTJ ($I_{MTJ}$) depends on an effective TMR of the MTJ memory cell. The effective TMR not only is affected by the resistance of the MTJ but also the resistance of the write path, access transistors, read circuit, etc. In the applications, the effective TMR could be much lower (for instance just one-third) than the actual TMR of the MTJ. In addition, sizes of the MTJ cell and reference resistor are scaled down, and resistances of the MTJ cell $R_{MTJ}$ and the reference resistor $R_{Ref}$ are scaled up accordingly for successive technology nodes. The difference in the current between the MTJ cell and the reference cell, i.e., $\Delta I$ ($\Delta I_P$ or $\Delta I_{AP}$ respectively for MTJ in P-state and AP-state) scales down. Hence, as technology nodes advance, the detected signal degrades phenomenally.

Figure 10:
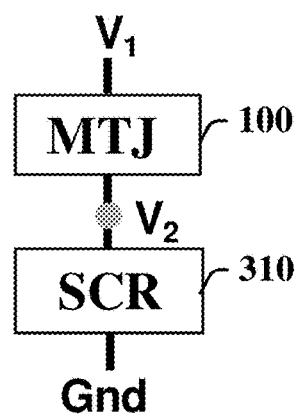
FIG. 10 shows an example load line analysis of a series connection of an MTJ memory cell and a forward biased SCR used for reading the MTJ memory device.
Figure 10:
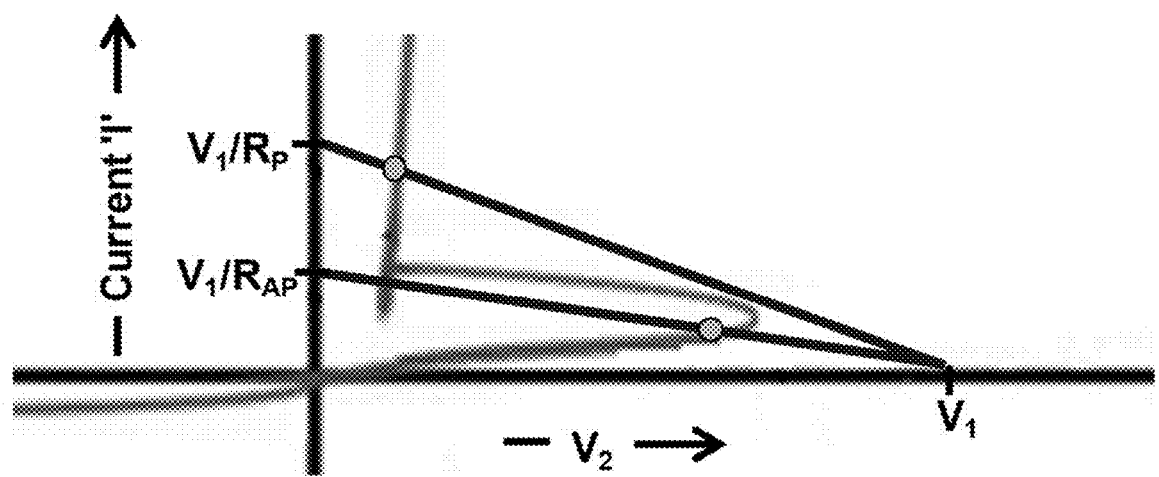

In view of above, the present disclosure provides reading circuits and techniques for reading MTJ memory cells that enhance a ratio for the read-current between MTJ's P-state and AP-state beyond a ratio enabled by an effective TMR of an MTJ array $TMR_{array}$, thereby improving the read disturb rate (RDR) while maintaining the pre-designed low write current. One or more non-linear resistors (NLRs) are added to the read system. In some embodiments, a first non-linear resistor (NLR) is connected in series with an MTJ cell to enhance the effective TMR by providing a greater resistance when the MTJ cell is in a high-resistance (e.g., AP-state) and a smaller resistance when the MTJ cell is in a low-resistance state (e.g., P-state). The effective TMR can be designed to be even greater than the TMR of the MTJ itself. In some further embodiments, a second non-linear resistor (NLR) may also be added in series with a reference resistor to improve the readability further. In some embodiments, the non-linear resistor (NLR) can have a current controlled negative resistance, i.e., an S-type negative resistance (NR). An example IV characteristic curve of an S-type negative resistor is shown in FIG. 10. The S-type negative resistor may be a component (e.g., forwardly biased thyristor, SCR, diac, triac, etc.) or an equivalent sub-circuit.

FIG. 1 illustrates some embodiments of a magnetic tunnel junction (MTJ) memory cell 100 that can be used with various read techniques as provided herein. The MTJ memory cell 100 includes a magnetic tunnel junction (MTJ) memory element 102 and an access transistor 104. A bit-line (BL) is coupled to one end of the MTJ memory element 102, and a source-line (SL) is coupled to an opposite end of the MTJ memory element through the access transistor 104. Thus, application of a suitable word-line (WL) voltage to a gate electrode of the access transistor 104 couples the MTJ memory element 102 between the BL and the SL, and allows a bias to be applied over the MTJ memory element 102 through the BL and the SL. Consequently, by providing suitable bias conditions, the MTJ memory element 102 can be switched between two states of electrical resistance, a first state with a low resistance (the P-state, magnetization directions of the reference layer and the free layer are parallel) and a second state with a high resistance (the AP-state, magnetization directions of the reference layer and free layer are antiparallel), to store data.

In some embodiments, the MTJ memory element 102 comprises the reference layer 106 and a free layer 108 disposed over the reference layer 106 and separated from the reference layer 106 by a barrier layer 110. The reference layer 106 is a ferromagnetic layer that has a magnetization direction that is "fixed". As an example, the magnetization direction of the reference layer 106 can be "up", i.e., perpendicular to the plane of the reference layer 106 pointing upwardly along the z-axis. The barrier layer 110, which can manifest as a thin dielectric layer or non-magnetic metal layer in some cases, separates the reference layer 106 from the free layer 108. The barrier layer 110 can be a tunnel barrier which is thin enough to allow quantum mechanical tunneling of current between the reference layer 106 and the free layer 108. In some embodiments, the barrier layer 110 can comprise an amorphous barrier, such as aluminum oxide ($AlO_x$) or titanium oxide ($TiO_x$), or a crystalline barrier, such as manganese oxide (MgO) or a spinel (e.g., $MgAl_2O_4$). The free layer 108 is capable of changing its magnetization direction between one of two magnetization states, which correspond to binary data states stored in the memory cell. For example, in a first state, the free layer 108 can have an "up" magnetization direction in which the magnetization of the free layer 108 is aligned in parallel with the magnetization direction of the reference layer 106, thereby providing the MTJ memory element 102 with a relatively low resistance. In a second state, the free layer 108 can have a "down" magnetization direction which is aligned and anti-paralleled with the magnetization direction of the reference layer 106, thereby providing the MTJ memory element 102 with a relatively high resistance. The magnetic directions disclosed herein could also be "flipped" or in-plane (e.g., pointing in the x and/or y directions), rather than up-down depending on the implementation. In some embodiments, the free layer 108 may comprise magnetic metal, such as iron, nickel, cobalt, boron, and alloys thereof, for example, such as a CoFeB alloy ferromagnetic free layer. Although this disclosure is described largely in terms of MTJs, it is also to be appreciated that it is applicable to spin valve memory elements, which may use a magnetically soft layer as the free layer 108, and a magnetically hard layer as the reference layer 106, and a non-magnetic barrier separating the magnetically hard layer and magnetically soft layer. The barrier layer 110 of a spin valve is typically a non-magnetic metal. Examples of non-magnetic metals include, but are not limited to: copper, gold, silver, aluminum, lead, tin, titanium and zinc; and/or alloys such as brass and bronze.

A synthetic anti-ferromagnetic (SyAF) layer 105 is disposed under the reference layer 106 or at one side of the reference layer 106 opposite to the free layer 108. The SyAF layer 105 is made of ferromagnetic materials having constrained or "fixed" magnetization directions. This "fixed" magnetization direction can be achieved in some cases by an initializing exposure to a high magnetic field after the entire chip is manufactured. As an example, the SyAF layer 105 may comprise a pair of pinning layers including a first pinning layer 114 and a second pinning layer 118. The first pinning layer 114 and the second pinning layer 118 may have opposite magnetization directions aligned with the magnetization direction of the reference layer 106. Using the same example given above, the first pinning layer has the same "up" magnetization direction with the reference layer. The second pinning layer has an opposite "down" magnetization direction aligned and is anti-paralleled with the magnetization direction of the reference layer 106. An interlayer spacer layer 116 is disposed between the first pinning layer 114 and the second pinning layer 118. The interlayer spacer layer 116 can be an anti-parallel coupling (APC) layer that causes an interexchange coupling (IEC) between the first pinning layer 114 and the second pinning layer 118 such that the first pinning layer 114 and the second pinning layer 118 have anti-parallel magnetic directions and stable each other. As an example, the interlayer spacer layer 116 may comprise ruthenium (Ru) or Iridium (Jr). The first pinning layer 114 may include cobalt layers and nickel layers one stacked above another $(Co/Ni)_m$. The first pinning layer 114 may also be cobalt palladium stack $(Co/Pd)_m$, or cobalt platinum stack $(Co/Pt)_m$, where m can be a positive integer. The second pinning layer 118 may comprise a reverse of the compositions of the first pinning layer 114 with the same or different amount of layers. For example, the second pinning layer 118 may include nickel layers and cobalt layers one stacked above another $(Ni/Co)_n$, or palladium cobalt stack $((Pd/Co)_n$, or platinum cobalt stack $(Pt/Co)_n$, where n can be a positive integer. A transition layer 112 may be disposed between the first pinning layer 114 and the reference layer 106. The transition layer 112 is made of non-magnetic materials and is configured as a buffer layer, a lattice match layer, and/or a diffusion barrier. As an example, the transition layer 112 may comprise tantalum (Ta), tungsten (W), molybdenum (Mo), Hafnium (Hf), or CoFeW.

Figure 2:
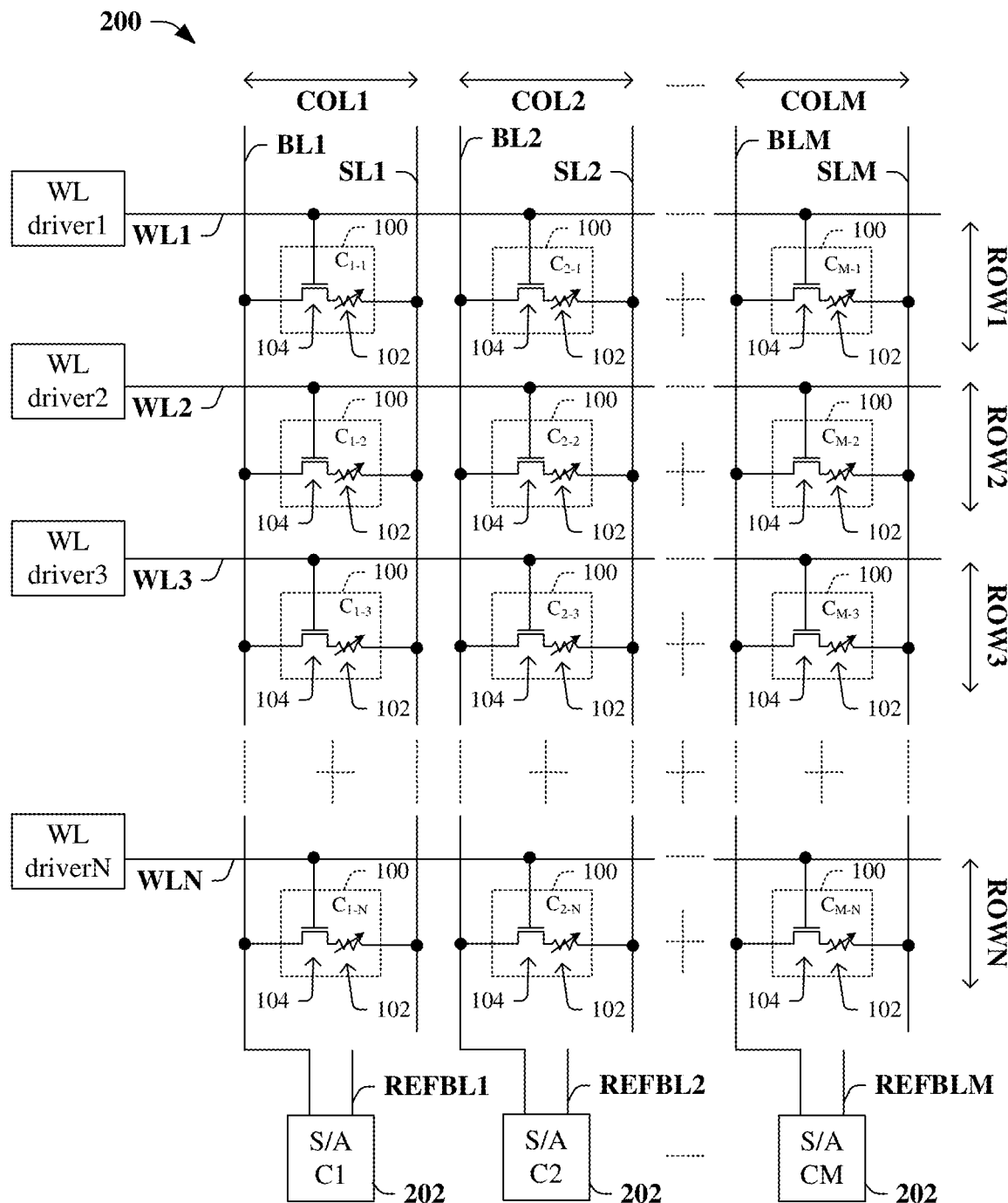
FIG. 2 illustrates a diagram depicting some embodiments of a memory device including an array of MTJ memory cells and associated read circuitry.

FIG. 2 illustrates a memory device 200 that includes a number of MTJ memory cells 100 according to some embodiments of the present disclosure. Each MTJ memory cell 100 includes an MTJ memory element 102 and an access transistor 104. The MTJ memory cells 100 are arranged in M columns (bits), and N rows (words), and are labeled $C_{ROW-COLUMN}$ in FIG. 2. Word-lines (WL) extend along respective rows and are coupled to gate electrodes of the access transistors 104 along the respective rows. Bit-lines (BL) and source-lines (SL) extend along respective columns, with the BLs being coupled to the free layers of the MTJ memory elements 102, and the SLs being coupled to the reference layers of the MTJ memory elements 102 through the access transistors 104. For example, in Row 1 of the memory device 200, the cells $C_{1-1}$ through $C_{M-1}$ form an M-bit data word accessible by activation of word-line WL1. Thus, when WL1 is activated, data states can be written to or read from the respective cells $C_{1-1}$ through $C_{M-1}$ through bit-lines $BL_1$ through $BL_M$ and/or by source-lines $SL_1$ through $SL_M$. Each column also has a sense amplifier (S/A) that is used to detect a stored data state from an accessed cell of the column during a read operation. Thus, the data in the accessed cells is sensed using sense amp circuits 202 (S/A $C_1$ through S/A $C_M$) associated with columns 1 through M, respectively. For example, when $WL_1$ is activated (other WLs are deactivated), the bit-lines ($BL_1$ through $BL_M$, respectively) develop respective biases corresponding to the respective data states stored in the accessed memory cells ($C_{1-1}$ through $C_{M-1}$, respectively); and the sense amps (S/A $C_1$ through S/A $C_M$, respectively) detect the data states from the bit-lines ($BL_1$ through $BL_M$, respectively).

During a typical write operation to Row 1, a voltage $V_{WL}$ is applied to a word-line $WL_1$, wherein the $V_{WL}$ is typically greater than or equal to a threshold voltage of the access transistors 104, thereby turning on the access transistors within Row 1 and coupling the bit-lines $BL_1$-$BL_M$ to the MTJ memory elements 102 in the accessed cells (e.g., memory cells $C_{1-1}$ through $C_{1-M}$). Suitable voltages are applied to the bit-lines $BL_1$-$BL_M$ and source-lines $SL_1$-$SL_M$, where the voltage on each bit-line is representative of a data value to be written to the memory cell attached to that bit-line. While Row 1 is accessed, the word-lines of the other rows ($WL_2$-$WL_N$) remain off, such that the MTJ memory elements of the other cells remain isolated and are not written to or read from.

During a typical read operation of Row 1, voltage $V_{WL}$ is again applied to word-line $WL_1$ to turn on the access transistors 104 and couple the bit-lines $BL_1$ through $BL_M$ to the MTJ memory elements of the accessed cells ($C_{1-1}$ through $C_{1-M}$). The MTJ memory elements then discharge charge through the access transistors 104 to the bit-lines $BL_1$ through $BL_M$, based on their stored states, thereby causing the bit-line voltages $BL_1$-$BL_M$ to change. The amount by which the bit-line voltages change depends upon the state of the MTJ memory elements 102 being accessed. To determine whether the state of the MTJ memory elements being accessed is a "1" or a "0", one differential input terminal of each sense amp 202 is coupled to the bit-line of the column (e.g., S/A C1 is coupled to bit-line $BL_1$) and the other differential sense amp input is coupled to a reference voltage (e.g., reference bit-line $REFBL_1$ in this example). Depending upon whether the cell bit-line $BL_1$ is high or low relative to the reference voltage on $REFBL_1$, the sense amp returns a "1" or a "0".

It will be appreciated that current can flow in various directions depending on the implementation. In some embodiments, read current flows from the BL to the SL. However, a backward read can also occur in other embodiments, in which read current flows from the SL to the BL. Also, the entire MTJ structure can be fabricated upside down and is called top-pinning MTJ. Hence, in the case of a top-pinning MTJ, the BL is nearer the reference layer 106, and the SL is nearer the free layer 108.

Figure 3:
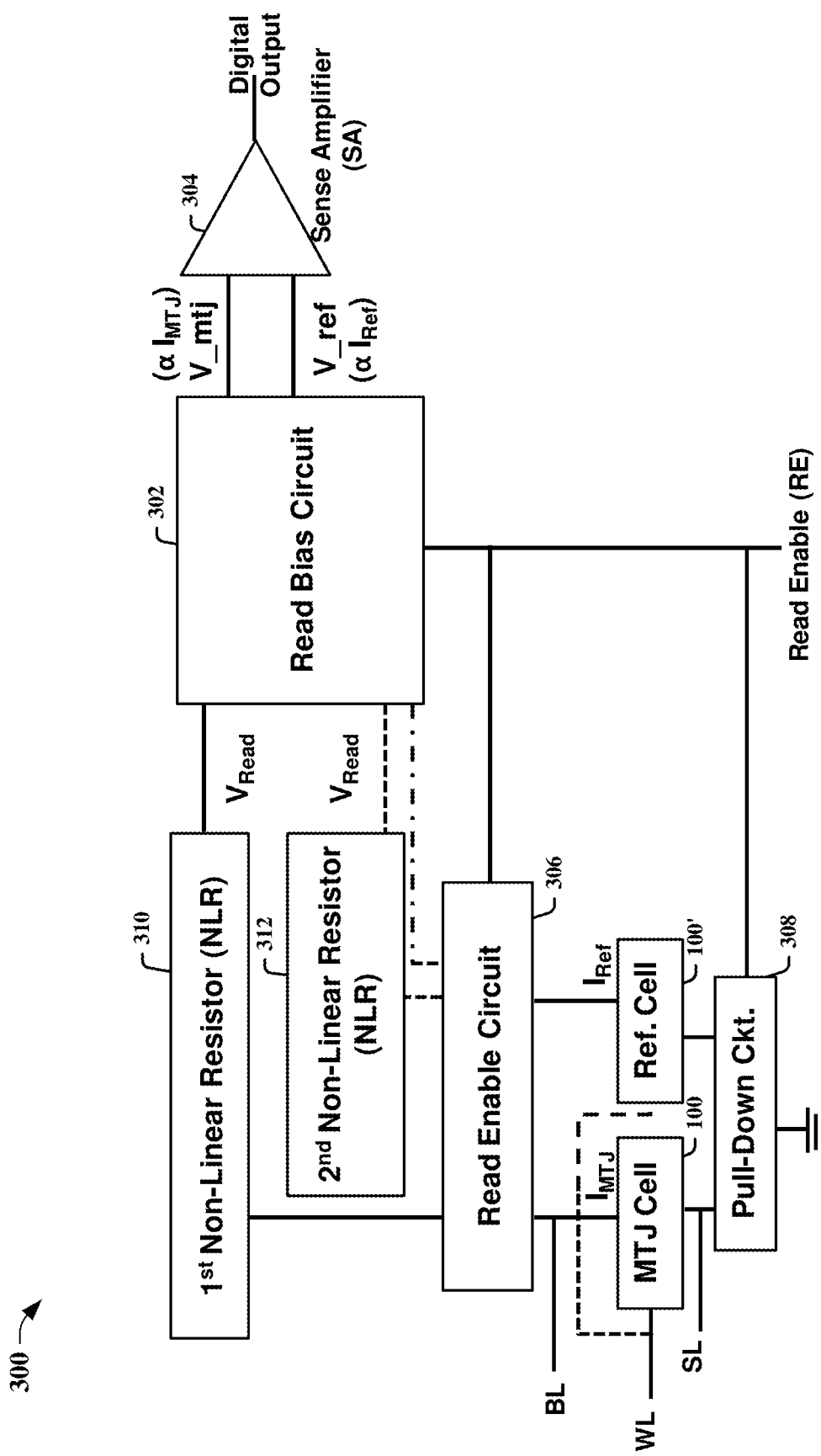
FIG. 3 illustrates a block diagram for some embodiments of a reading circuit that can be used in the memory device of FIG. 2.

FIG. 3 illustrates a block diagram for some embodiments of a reading circuit 300 that can be used in the memory device 200 of FIG. 2. For simplicity, an MTJ memory cell 100 is shown in FIG. 3, though it will be appreciated that additional memory cells can be arranged in parallel with the illustrated MTJ memory cell 100 via a bit line BL and a source line SL consistent with FIG. 2. The reading circuit 300 comprises a reading bias circuit 302. During a read operation, the reading bias circuit 302 provides a reading voltage $V_{read}$ for the MTJ memory cell 100 and a reference cell 100' and accordingly output an output signal. A current mirror circuit may be used as a load of the read bias circuit. A sense amplifier 304 may be used to generate a digital output signal by processing output signals of the reading bias circuit 302. For example, the reading bias circuit 302 may sense a read current $I_{MTJ}$ flowing through the MTJ cell 100 and a reference current $I_{Ref}$ flowing through the reference cell and generate a sensing voltage $V_{mtj}$ and a reference voltage $V_{ref}$ to feed into the sense amplifier 304. A read enable circuit 308 can pull up a voltage level (e.g., a voltage level on the bit line BL) during the read operation, and a pull-down circuit 310 can pull down a voltage level (e.g., a voltage level on the source line SL) during the read operation.

A first non-linear resistor (NLR) device 310 is coupled to the MJT cell 100 in series and provides a transmission path for the read current $I_{MTJ}$. The first NLR device 310 may be connected between the read bias circuit 302, and the read enable circuit 306. The first NLR device 310 is configured to provide a resistance that provides adjustment for a current flowing through the MTJ cell 100. The resistance of the first NLR device 310 may decrease as the voltage applied on the first NLR device 310 increases. In some embodiments, the first NLR device 310 is an S-type negative resistance (NR) such as a forwardly biased thyristor (e.g., silicon control rectifier (SCR), diac, triac, etc.).

In some further embodiments, a second NLR device 312 is also coupled to the reference cell 100' in series and provides adjustment for a reference current $I_{ref}$. The second NLR device 312 may be connected between the read bias circuit 302, and the read enable circuit 306 in parallel with the first NLR device 310. The second NLR device 312 provides an adjustment to the reference current $I_{REF}$ such that the reference current $I_{REF}$ fall within the range between the read current of P-state and AP-state. The second NLR device 312 may have same or similar features as the first NLR device 310. As an example, for S-type negative resistance (NR) such as a forwardly biased thyristor (e.g., SCR, diac, triac, etc.), a reverse-biased zener diode, or equivalent transistor circuits, there shouldn't be a need of NLR for the reference cell since the separation between the $R_{AP}+R_{NLR}$ and $R_P+r_{NLR}$ should be large; but for a forward-biased conventional diode (e.g., pn-diode, Schottky diode) or equivalent transistor circuit, since $R_{NLR}$ and $r_{NLR}$ could be quite close, NLR should be added in read path of reference cell as well.

Figure 4A:
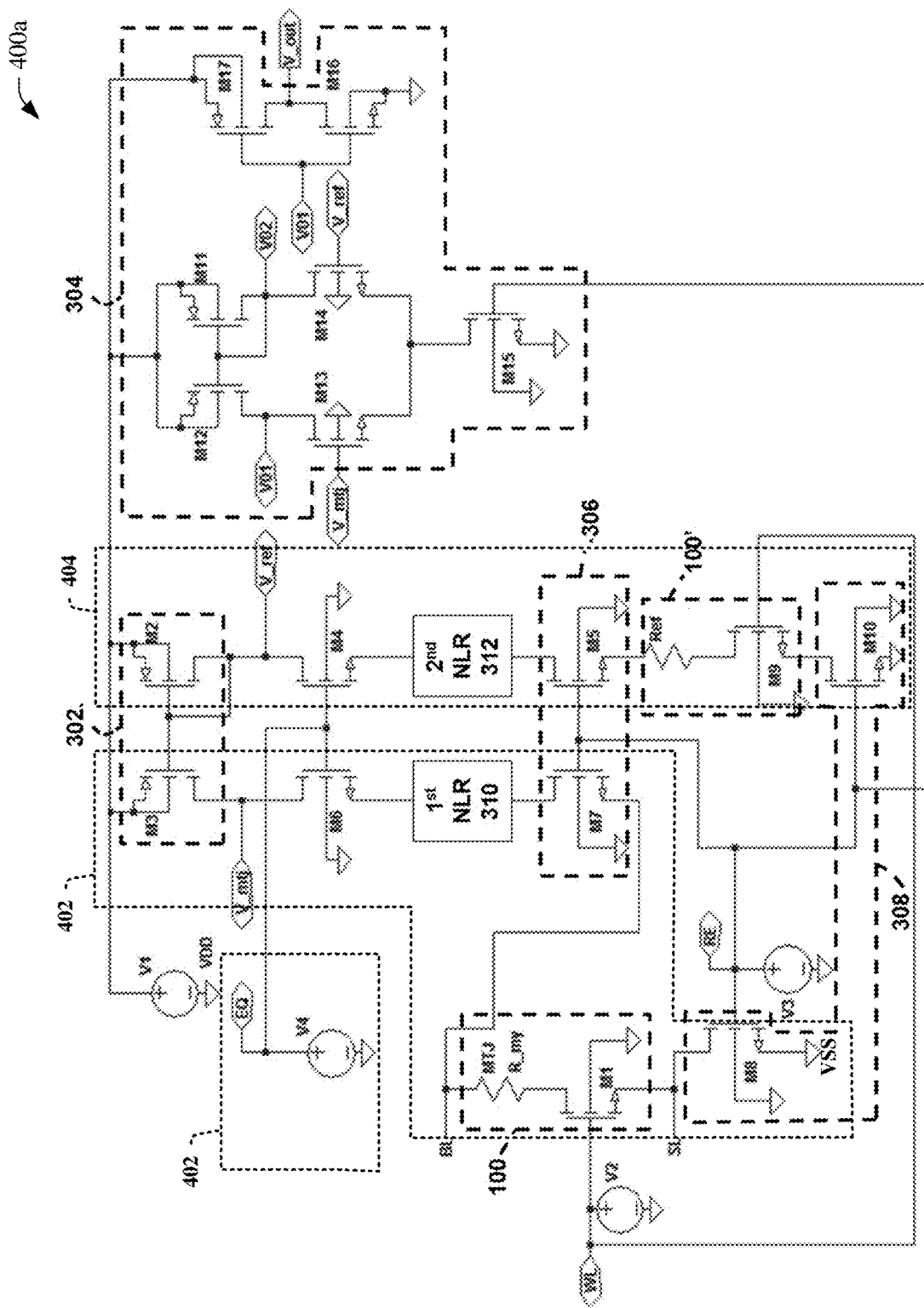
FIG. 4A illustrates a circuit schematic for some embodiments of a data path that can be used in the memory device of FIG. 2.
Figure 4B:
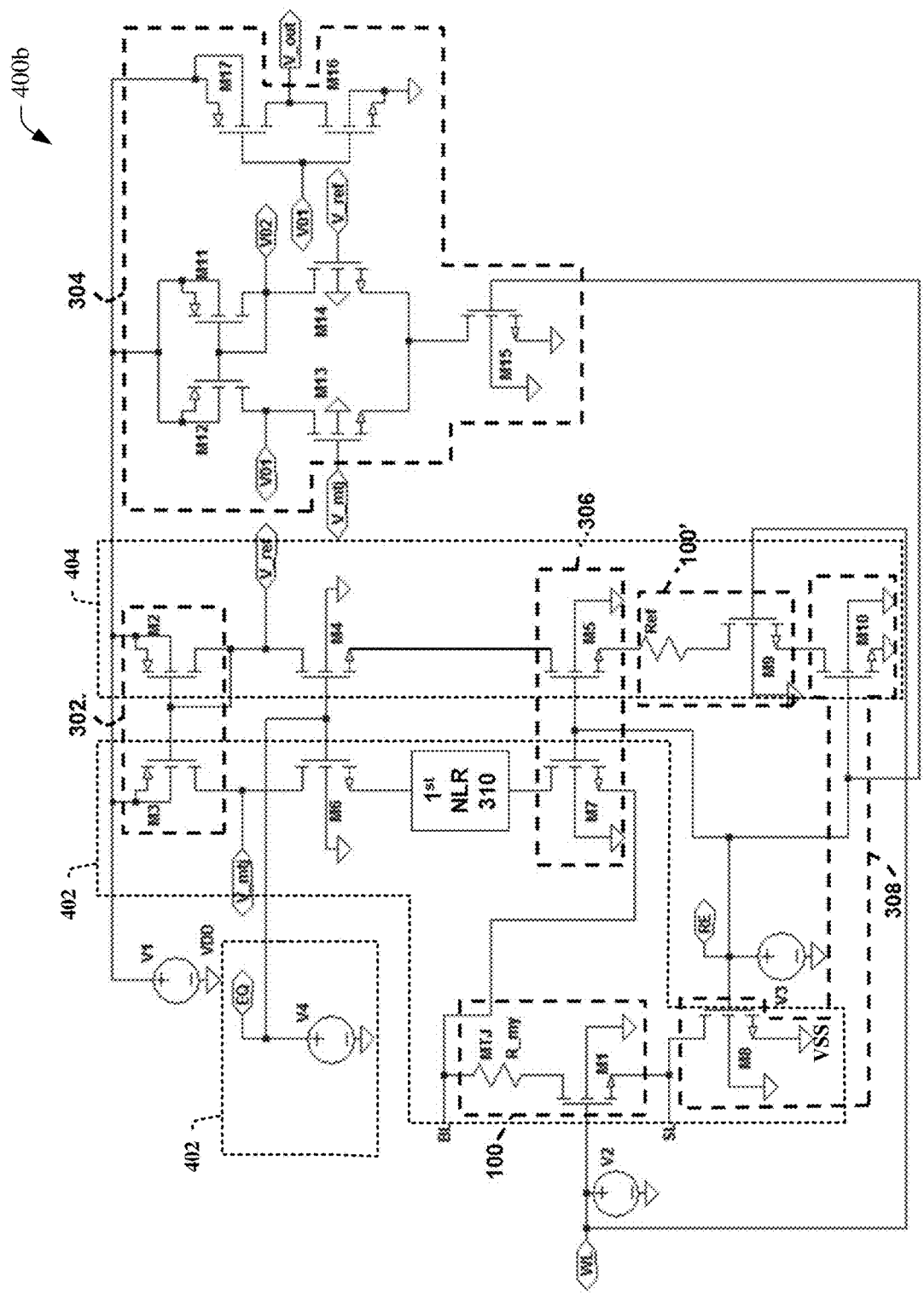
FIG. 4B illustrates a circuit schematic for some alternative embodiments of a data path that can be used in the memory device of FIG. 2.

FIG. 4A and FIG. 4B illustrate schematic views of data paths 400a and 400b of the memory array in more detail. The data path 400a or 400b corresponds to a single column of the memory array of FIG. 2, albeit along with some standard additional circuitry which was omitted from FIG. 2 for simplicity. For clarity, the data path 400a or 400b is illustrated with only a single MTJ memory cell 100, though it will be appreciated that additional memory cells can be arranged in parallel with the illustrated MTJ memory cell 100 via BL and SL consistent with FIG. 2.

The data path 400a includes an MTJ current path 402 and a reference current path 404, which are arranged in parallel with one another between $V_{DD}$ and $V_{SS}$. A reading bias circuit 302 can be a differential amplifier. The reading bias circuit 302 may include a current mirror circuit including transistors M3, M2 used as a load for the MTJ current path 402 and the reference current path 404. Transistors M4 and M6 can be driven by the same input voltage V4 from an equalizer. A read enable circuit 306 may include transistors M5, M7 that respectively pulls up a voltage level for the MTJ current path 402 and the reference current path 404 during the read operation. A pull-down circuit 308 may include transistors M8, M10 that respectively pulls down a voltage level for the MTJ current path 402 and the reference current path 404 during the read operation. The read enable circuit 306 and the pull-down circuit 308 cut off the read circuit when the read operation is not required. A sense amplifier 304 may include a differential amplifier having transistors M11-M15. M13 and M14 are driven by different voltages $V_{mtj}$ and $V_{ref}$. M12 and M11 serve as current mirror load. The voltage outputs of M13 and M14 are sensed at the respective drain terminals. V01 is fed into, for instance, an inverter which acts as a simple sense amplifier, shapes waveform and ensures correct polarity of the output in this implementation. The sense amplifier 304 is configured to detect a data state from the MTJ memory cell 100 by comparing a voltage provided by the memory cell 100 ($V_{mtj}$) with a reference voltage ($V_{ref}$) provided by a reference memory cell 100'. Based on these voltages ($V_{mtj}$, $V_{Ref}$), the sense amplifier 304 provides an output voltage ($V_{Out}$) that is in one of two states, representing a logical "1" or a logical "0", which was stored in the accessed memory cell 100.

The MTJ current path 402 includes a first current mirror transistor M3, a first pull-up read-enable transistor M7, the MTJ memory cell 100 (including an MTJ memory element MTJ and a first access transistor M1), and a first pull-down read-enable transistor M8. Bit-line (BL) and source-line (SL) are coupled to opposite ends of the MTJ memory cell 100. The BL is coupled to the MTJ memory element MTJ, and the SL is coupled to the first access transistor M1 and is separated from the MTJ memory element MTJ by the first access transistor M1. The reference current path 404 includes a second current mirror transistor M2; a second pull-up read-enable transistor M5; the reference MTJ memory cell 100' (including a reference MTJ memory element Ref, which can be implemented as a resistor with a fixed resistance in some embodiments, and a second access transistor M9); and a second pull-down read-enable transistor M10. A reference bit-line ($BL_{Ref}$) and reference source-line ($SL_{Ref}$), which have lengths and resistances that are substantially equal to those of the BL and SL, are coupled to opposite ends of the reference MTJ memory cell 100'. The $BL_{Ref}$ is coupled to the reference MTJ memory element Ref, and the $SL_{Ref}$ is coupled to the second access transistor M9 and is separated from the reference MTJ memory element Ref by the second access transistor M9.

Control signals are provided to a word-line node WL and a read-enable node RE to facilitate read and write operations. The word-line node WL may be biased by a voltage source V2, and the read-enable node RE may be biased by a voltage source V3 during read and write operations. The word-line node WL is coupled to respective gates of the first access transistor M1 and the second access transistor M9. The read-enable node RE is coupled to respective gates of the pull-up transistors M7, M5, and the pull-down transistors M8, M10. The read-enable node RE is typically low (e.g., 0 volts) during write operations, and is typically high ($V_{DD}$) during read operations.

A first NLR device 310 is coupled in the MTJ current path 402. The first NLR device 310 may be connected in series and between the first pull-up read-enable transistor M7 and the first current mirror transistor M3. The first NLR device 310 is configured to provide a resistance that provides adjustment for a current flowing through the MTJ current path 402. The resistance of the first NLR device 310 may decrease as the voltage applied on the first NLR device 310 increases, and thus increase an effective tunnel magnetoresistance (TMR) of the MTJ memory cell. TMR of an MTJ cell is defined as $(R_{AP}-R_P)/(R_{Path}+R_P+R_{MOS})=(I_P-I_{AP})/I_{AP}$, where $R_{AP}$ is the electrical resistance of the MTJ element in the anti-parallel state; $R_P$ is the resistance of the MTJ element in the parallel state; $R_{Path}$ is the resistance of the write path; $R_{MOS}$ is the resistance of the access transistor; $I_P$ is the current in the parallel state; and $I_{AP}$ is the current in the anti-parallel state.

Using an MTJ with positive tunneling magnetoresistance (TMR) as an example for illustration. If the magnetization directions of the reference layer and free layer are in a parallel orientation, the MTJ is in a low-resistance state (P-state). If the magnetization directions of the reference layer and free layer are in an anti-parallel orientation, the MTJ is in a high-resistance state (AP-state). The insertion of the first NLR device 310 increases $I_p$ and decrease $I_{ap}$, and thus increase TMR. The first NLR device 310 provides a first resistance ($r_{nlr}$) when the low-resistance state P-state is read and a second resistance ($R_{nlr}$) greater than the first resistance ($r_{nlr}$) when the high-resistance state AP-state is read. Thus, the difference between $I_p$ and $I_{ap}$ is increased. The effective TMR becomes: $\{(R_{AP}-R_P)+(R_{nlr}-r_{nlr})\}/(R_{Path}+R_P+R_{MOS}+r_{SD})$. The insertion of the first NLR device 310 also provides more margin to design the reference memory cell 100'. The reference resistor $R_{ref}$ would be in a range between $R_{AP}+R_{nlr}$ and $R_P+r_{nlr}$, instead of in a smaller range between $R_{AP}$ and $R_P$. The reference memory cell 100' has a reference resistance greater than a sum of the first resistance ($R_P$) of the MTJ memory cell 100 and the first resistance ($r_{nlr}$) of the first NLR device 310 and smaller than a sum of the second resistance (RAP) of the MTJ memory cell 100 and the second resistance ($R_{nlr}$) of the first NLR device 310.

In addition, the insertion of the first NLR device 310 reduces the RDR for forward read direction, as the read current for AP-state is reduced. To maintain the same charging for P-state, the read voltage needs to be increased. There could be at least following three ways: increase the $V_{Read}$; increase a gate voltage $V_G$ of the access transistor; or increase both $V_{Read}$ and $V_G$.

Similarly, in some further embodiments, a second NLR device 312 is also coupled to the reference cell 100' in series and provides adjustment for a reference current $I_{ref}$. The second NLR device 312 may be connected between the read bias circuit 302 and the read enable circuit 306 in parallel with the first NLR device 310. The second NLR device 312 may have same or similar features as the first NLR device 310.

FIG. 4B shows the data path 400b. Compared to the data path 400a in FIG. 4A, the second NLR device 312 is not present. Thus M4 is connected to M5 while M6 is separated from M7 by the first NLR device 310. As an example, for S-type negative resistance (NR) such as a forward biased thyristor (e.g. SCR, diac, triac, etc), a reverse-biased zener diode, or equivalent transistor circuits, there shouldn't be a need of NLR for the reference cell 100' since the separation between the $R_{AP}+R_{NLR}$ and $R_P+r_{NLR}$ should be large; but for a forward-biased conventional diode (e.g., pn-diode, Schottky diode) or equivalent transistor circuit, since $R_{NLR}$ and $r_{NLR}$ could be quite close, NLR should be added in read path of reference cell as well.

Figure 5:
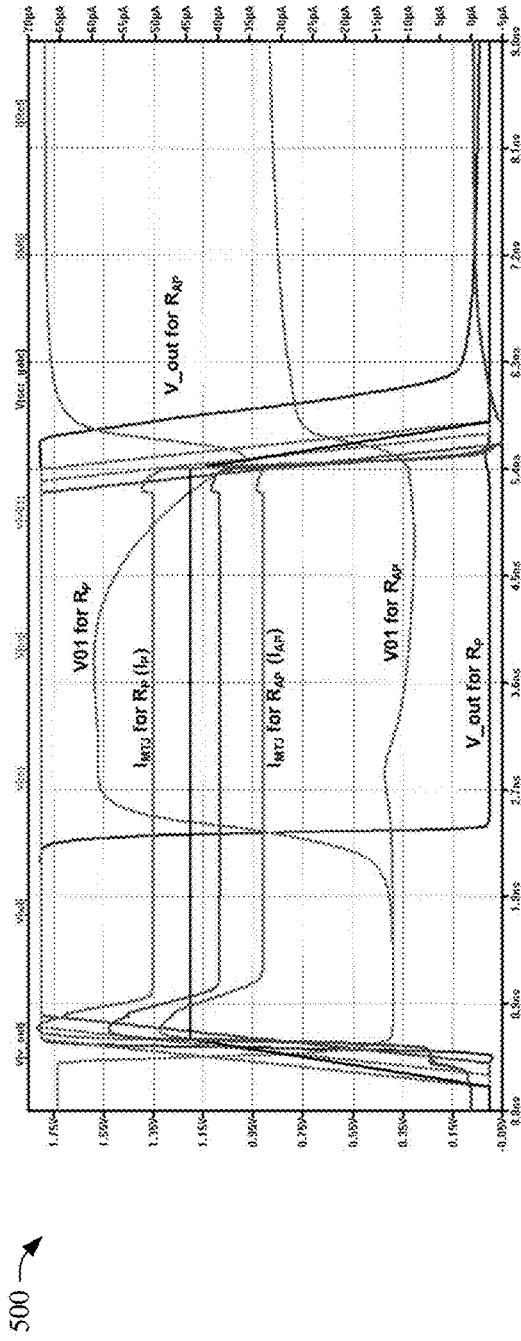
FIGS. 5-6 illustrate timing diagrams depicting some embodiments of reading operations for a memory device, such as the memory device shown in FIGS. 3-4B.
Figure 6:
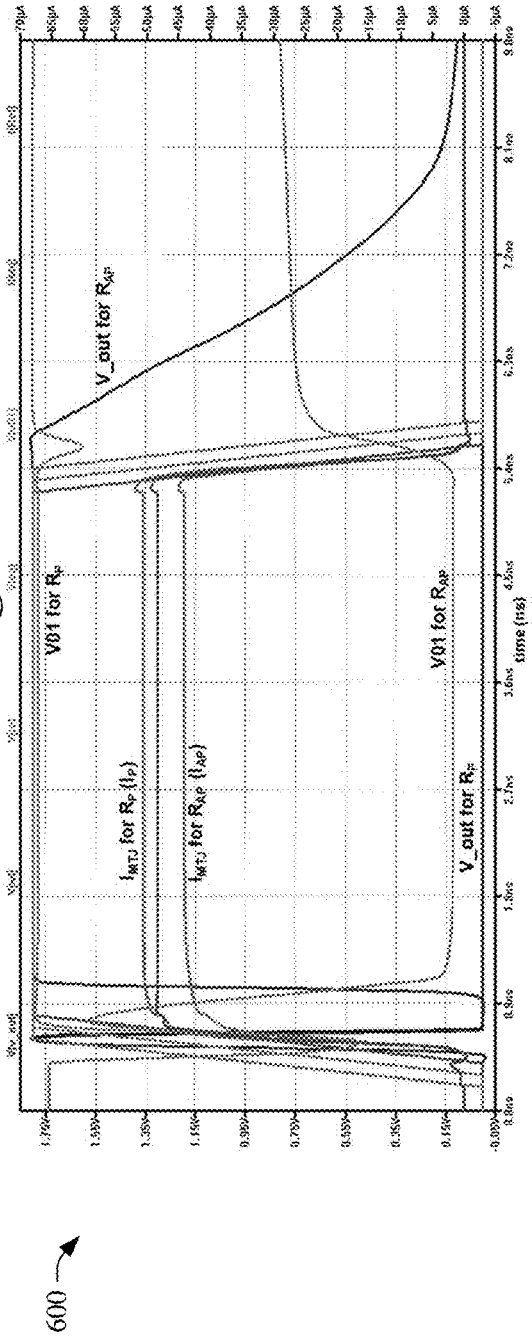

Referring now to FIG. 5, a description of some embodiments of how the data paths 400a, 400b can operate during read operations is provided with regards to a timing/waveform diagram. FIG. 5 shows waveforms for two read operations on a single MTJ memory cell superimposed over one another to show how the current and voltage levels relate to one another. FIG. 6 shows waveforms for two read operations of a reading operation without an NLR device for comparison purpose. For a first read operation, the MTJ is in a parallel state, such that the first read operation returns a low voltage (e.g., logical "0"). For the second read operation, the MTJ is in an anti-parallel state, such that the second read operation returns a high voltage (e.g., logical "1"). As shown in FIG. 5 and FIG. 6, when V(re) is active to enable read operation, V(scr_gate) is active, and V_mtj changes in response to I(Mtj). SA may generate V_out according to V01, which is changed in response to V_mtj. For a comparison circuit without NLR devices shown in FIG. 6, $I_P$ is 50.6 µA; $I_{AP}$ is 44.1 µA, and thus a sensed TMR is around 14.74%. A read time is about 7.4 ns. The SCR gate voltage is tuned to make sure that P-state current IP is same for comparison purpose. From simulated waveforms shown in FIG. 6, $I_P$ in the disclosed reading operation is 50.4 µA; $I_{AP}$ is 32.9 µA, and thus, the sensed TMR is around 53.19%. Also seen from the waveforms, a read time is about 5.4 ns. Thus, AP-state current $I_{AP}$ of the disclosed reading operation of FIG. 5 is reduced, and TMR for the proposed circuit is relatively high as compared to that of the reading operation of FIG. 6. Also, the disclosed circuit can perform read operations at higher read speed.

Figure 7:
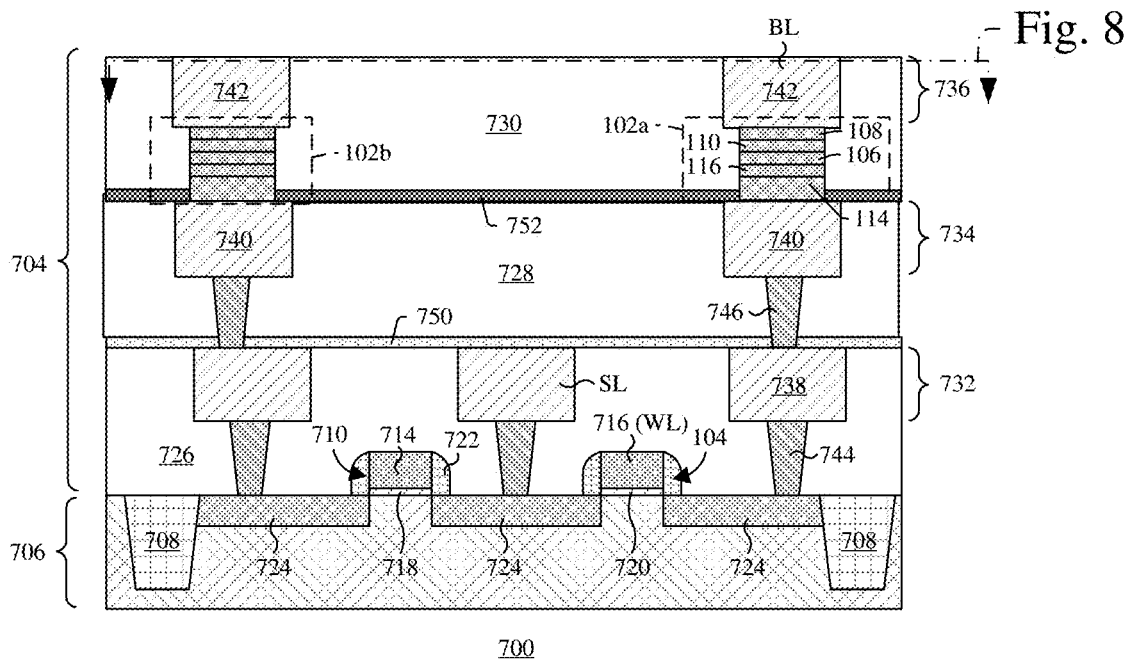
FIG. 7 illustrates a cross-sectional diagram showing some embodiments of a memory device that includes an MTJ memory element.

FIG. 7 illustrates a cross-sectional view of some embodiments of an integrated circuit 700, which includes MTJ memory elements 102a, 102b disposed in an interconnect structure 704 of the integrated circuit 700. The integrated circuit 700 includes a substrate 706. The substrate 706 may be, for example, a bulk substrate (e.g., a bulk silicon substrate) or a silicon-on-insulator (SOI) substrate. The illustrated embodiment depicts one or more shallow trench isolation (STI) regions 708, which may include a dielectric-filled trench within the substrate 706.

Two access transistors 710, 712 are disposed between the STI regions 708. The access transistors 710, 104 include access gate electrodes 714, 716, respectively; access gate dielectrics 718, 720, respectively; access sidewall spacers 722; and source/drain regions 724. The source/drain regions 724 are disposed within the substrate 706 between the access gate electrodes 714, 716 and the STI regions 708, and are doped to have a first conductivity type which is opposite a second conductivity type of a channel region under the gate dielectrics 718, 720, respectively. The word line gate electrodes 714, 716 may be, for example, doped polysilicon or a metal, such as aluminum, copper, or combinations thereof. The word line gate dielectrics 718, 720 may be, for example, an oxide, such as silicon dioxide, or a high-☐ dielectric material. The word line sidewall spacers 722 can be made of silicon nitride (e.g., $Si_3N_4$), for example.

The interconnect structure 704 is arranged over the substrate 706 and couples devices (e.g., transistors 710, 104) to one another. The interconnect structure 704 includes a plurality of IMD layers 726, 728, 730, and a plurality of metallization layers 732, 734, 736 which are layered over one another in alternating fashion. The IMD layers 726, 728, 730 may be made, for example, of a low κ dielectric, such as un-doped silicate glass, or an oxide, such as silicon dioxide. The metallization layers 732, 734, 736 include metal lines 738, 740, 742, which are formed within trenches, and which may be made of a metal, such as copper or aluminum. Contacts 744 extend from the bottom metallization layer 732 to the source/drain regions 724 and/or gate electrodes 714, 716; and vias 746 extend between the metallization layers 732, 734, 736. The contacts 744 and the vias 746 extend through dielectric-protection layers 750, 752 (which can be made of dielectric material and can act as etch stop layers during manufacturing). The dielectric-protection layers 750, 752 may be made of an extreme low-☐ dielectric material, such as SiC, for example. The contacts 744 and the vias 746 may be made of a metal, such as copper or tungsten, for example.

MTJ memory elements 102a, 102b, which are configured to store respective data states, are arranged within the interconnect structure 704 between neighboring metal layers. The MTJ memory element 102a includes an MTJ, including a pinning layer 114, a metallic interlayer 116, a reference layer 106, a barrier layer 110, and a free layer 108.

Figure 8:
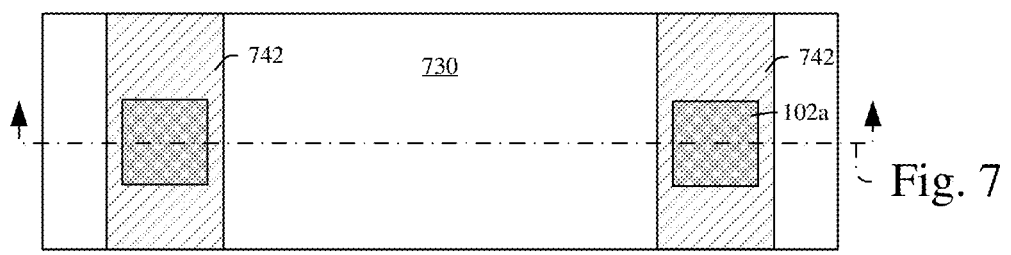
FIG. 8 illustrates a top view of the memory device of FIG. 7, as indicated by the cut-lines in FIG. 7.

FIG. 8 depicts some embodiments of a top view of FIG. 7's integrated circuit 700 as indicated in the cut-away lines shown in FIGS. 7-8. As can be seen, the MTJ memory elements 102a, 102b can have a square/rectangular or circular/elliptical shape when viewed from above in some embodiments. In other embodiments, however, for example, due to practicalities of many etch processes, the corners of the illustrated square shape can become rounded, resulting in MTJ memory elements 102a, 102b having a square shape with rounded corners, or having a circular shape. The MTJ memory elements 102a, 102b are arranged over metal lines 740, respectively, and have upper portions in direct electrical connection with the metal lines 742, respectively, without vias or contacts there between in some embodiments. In other embodiments, vias or contacts couple the upper portion to the metal lines 742.

Figure 9:
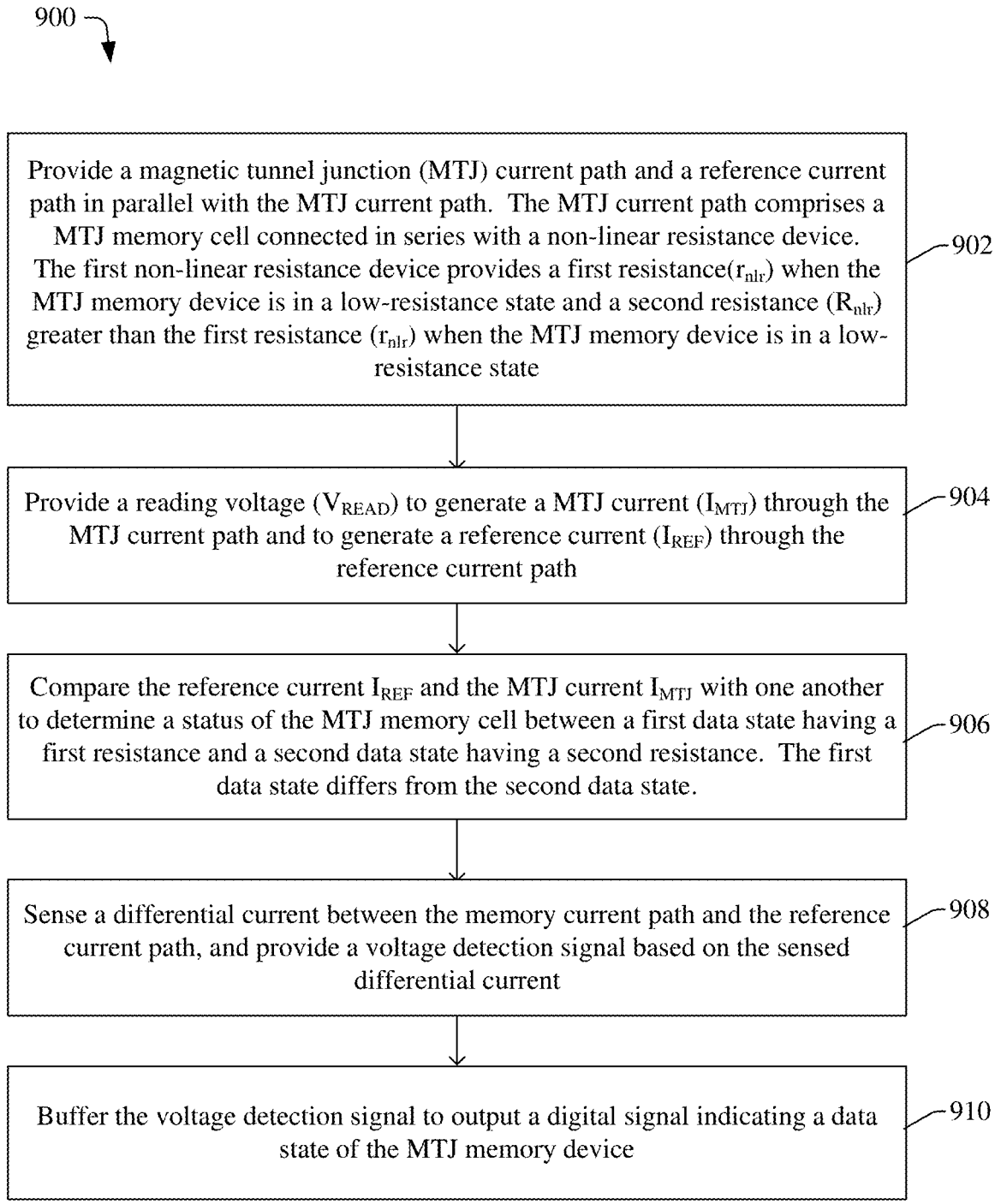
FIG. 9 illustrates a flowchart of some embodiments of a method of reading the MTJ memory device.

FIG. 9 illustrates a flowchart 900 of some embodiments of a method of reading from an MTJ memory cell.

At act 902, a memory device is provided. The memory device includes a magnetic tunnel junction (MTJ) current path and a reference current path in parallel with the MTJ current path. The MTJ current path comprises an MTJ memory cell connected in series with a non-linear resistance device. In some embodiments, this memory device can, for example, correspond to the memory device and the data path illustrated in FIGS. 1-4B.

At act 904, a reading voltage ($V_{READ}$) is provided to generate an MTJ current ($I_{MTJ}$) through the MTJ current path and to generate a reference current ($I_{REF}$) through the reference current path. In some embodiments, the MTJ current can correspond, for example, to signal $I_{MTJ}$ in FIG. 5, and the reference current can correspond, for example, to signal $I_{Ref}$ in FIG. 5.

At act 906, the reference current $I_{REF}$ and the MTJ current $I_{MTJ}$ are compared with one another to determine a status of the MTJ memory cell between a first data state having a first resistance and a second data state having a second resistance. The first data state differs from the second data state.

At act 908, a differential current between the memory current path and the reference current path is sensed. A voltage detection signal is detected based on the sensed differential current.

At act 910, the voltage detection signal is buffered to output a digital signal indicating a data state of the MTJ memory device.

FIG. 10 shows an example load line analysis of a series connection of an MTJ memory cell 100 and a forward biased SCR device as the first NLR device 310. The quiescent points for the P-state and the AP-state of the MTJ memory cell are shown in the figure as $V_1/R_P$ and $V_1/R_{AP}$. The IV curve of a negative resistance device including the SCR device has a region where for the differential increase in voltage is proportional to a differential decrease in current through the device, and vice versa, i.e., the IV characteristics have a negative slope. Note that this negative slope region slope is unstable. Therefore, the device operating points reside in the region of the positive slopes on either sides of the negative slope region. The operating points for the P-state and the AP-state are chosen to be different regions on either side of the negative region. Other NLR devices used for the disclosed reading path may operate similarly. The SCR device offers small resistance $r_{SCR}$ for P-state of the MTJ, while the SCR device offers a large resistance $R_{SCR}$ for AP-state. Therefore, the net resistance between the read voltage and the ground for P-state and AP-state respectively becomes: $R_{Path}+R_P+R_{MOS}+r_{SCR}$ and $R_{Path}+R_{AP}+R_{MOS}+R_{SCR}$. Therefore, the effective TMR is $(R_{AP}-R_P)/(R_{Path}+R_P+R_{MOS})$ without SCR. While the new effective TMR is $\{(R_{AP}-R_P)+(R_{SCR}-r_{SCR})\}/(R_{Path}+R_P+R_{MOS}+r_{SCR})$ after adding SCR. Thereby, the effective TMR can be improved, and thus makes it much easier to detect the difference in the read currents for P-state and AP-state.

Thus, in some embodiments, the present application provides a memory device. The memory device includes a first read bias transistor and a first pull-up read-enable transistor connected in series with the first read bias transistor. The memory device further includes an MTJ memory cell connected in series with the first pull-up read-enable transistor and a first pull-down read-enable transistor connected in series with the MTJ memory cell. The memory device further includes a first non-linear resistance device connected in series and between the first pull-up read-enable transistor and the first read bias transistor. The first non-linear resistance device is configured to provide a first resistance when conducting a first current and a second resistance greater than the first resistance when conducting a second current smaller than the first current.

In other embodiments, the present application provides a memory device. The memory device includes a first read bias transistor, a first pull-up read-enable transistor, an MTJ memory cell, and a first pull-down read-enable transistor connected in series. A source-line is coupled between the MTJ memory cell and the first pull-down read-enable transistor. A bit-line is coupled between the first pull-up read-enable transistor and the MTJ memory cell. The memory device further includes a second read bias transistor, a second pull-up read-enable transistor, a reference memory cell, and a second pull-down read-enable transistor connected in series and connected in parallel with the first read bias transistor, the first pull-up read-enable transistor, the MTJ memory cell, and the first pull-down read-enable transistor. A reference bit-line is coupled between the second pull-up read-enable transistor and the reference memory cell. A reference source-line is coupled between the reference memory cell and the second pull-down read-enable transistor. The memory device further includes a first non-linear resistance device coupled between the first pull-up read-enable transistor and the first read bias transistor. The first non-linear resistance device is configured to provide a first resistance when conducting a first current and a second resistance greater than the first resistance when conducting a second current smaller than the first current.

In yet other embodiments, the present disclosure provides a method for reading from a memory device. In the method, a magnetic tunnel junction (MTJ) current path is provided, and a reference current path is provided in parallel with the MTJ current path. The MTJ current path comprises an MTJ memory cell connected in series with a non-linear resistance device. A reading voltage or current is provided to generate an MTJ current or voltage through the MTJ current path and to generate a reference current or voltage through the reference current path. The reference current or voltage and the MTJ current or voltage are compared with one another to determine a data state of the MTJ memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A memory device, comprising:
   a first current mirror transistor;
   a first read bias transistor connected to the first current mirror transistor;
   a first pull-up read-enable transistor connected in series with the first read bias transistor;
   an MTJ memory cell connected in series with the first pull-up read-enable transistor;
   a first pull-down read-enable transistor connected in series with the MTJ memory cell; and
   a first non-linear resistance device connected in series and between the first pull-up read-enable transistor and the first read bias transistor, wherein the first non-linear resistance device is configured to provide a first resistance when conducting a first current and a second resistance greater than the first resistance when conducting a second current smaller than the first current.

2. The memory device of claim 1, wherein the first non-linear resistance device is an S-type negative resistor or an equivalent sub-circuit.

3. The memory device of claim 1, wherein the first non-linear resistance device is a silicon control rectifier (SCR) or a triac.

4. The memory device of claim 1, further comprising:
   a second current mirror transistor;
   a second read bias transistor connected to the second current mirror transistor and in parallel with the first read bias transistor;
   a second pull-up read-enable transistor in series with the second read bias transistor;
   a reference memory cell connected in series with the second pull-up read-enable transistor;
   a second pull-down read-enable transistor connected in series with the reference memory cell; and
   a second non-linear resistance device coupled between the second pull-up read-enable transistor and the second read bias transistor.

5. The memory device of claim 4, further comprising:
   a sense amplifier having a first input terminal and a second input terminal that are configured to receive a differential input signal, the first input terminal coupled to a first node of the first read bias transistor and the second input terminal coupled to a first node of the second read bias transistor.

6. The memory device of claim 5, wherein the first node of the first read bias transistor is connected to the first current mirror transistor.

7. The memory device of claim 5, wherein the first node of the second read bias transistor is connected to the second current mirror transistor.

8. The memory device of claim 1, wherein the MTJ memory cell is configured to switch between a first data state and a second data state, the first data state having a first resistance and the second data state having a second resistance greater than the first resistance.

9. The memory device of claim 1,
   wherein a source-line is coupled between the MTJ memory cell and the first pull-down read-enable transistor; and
   wherein a bit-line is coupled between the first pull-up read-enable transistor and the MTJ memory cell.

10. The memory device of claim 9, wherein the MTJ memory cell comprises a MTJ memory element and an access device connected in series, and wherein the MTJ memory element comprises:
    a ferromagnetic free layer connected to the bit-line;
    a ferromagnetic reference layer connected to the source-line; and
    a non-magnetic barrier layer disposed between and separating the ferromagnetic reference layer and the ferromagnetic free layer.

11. A memory device, comprising:
    a first current mirror transistor, a first read bias transistor, a first pull-up read-enable transistor, an MTJ memory cell, and a first pull-down read-enable transistor connected in series, wherein a source-line is coupled between the MTJ memory cell and the first pull-down read-enable transistor; and wherein a bit-line is coupled between the first pull-up read-enable transistor and the MTJ memory cell;
    a second current mirror transistor, a second read bias transistor, a second pull-up read-enable transistor, a reference memory cell, and a second pull-down read-enable transistor connected in series and connected in parallel with the first read bias transistor, the first pull-up read-enable transistor, the MTJ memory cell, and the first pull-down read-enable transistor, wherein a reference bit-line is coupled between the second pull-up read-enable transistor and the reference memory cell, and wherein a reference source-line is coupled between the reference memory cell and the second pull-down read-enable transistor; and
    a first non-linear resistance device coupled between the first pull-up read-enable transistor and the first read bias transistor, wherein the first non-linear resistance device is configured to provide a first resistance when conducting a first current and a second resistance greater than the first resistance when conducting a second current smaller than the first current.

12. The memory device of claim 11, wherein the first non-linear resistance device comprises an S-type negative resistor.

13. The memory device of claim 11, further comprising a second non-linear resistance device coupled between the second pull-up read-enable transistor and the second read bias transistor.

14. The memory device of claim 11,
    wherein the MTJ memory cell is configured to switch between a first data state and a second data state, the first data state having a first resistance and the second data state having a second resistance greater than the first resistance; and
    wherein the first non-linear resistance device is configured to provide the first resistance when the first data state is read and the second resistance when the second data state is read.

15. The memory device of claim 14,
    wherein the reference memory cell having a reference resistance greater than a sum of the first resistance of the MTJ memory cell and the first resistance of the first non-linear resistance device; and
    wherein the reference resistance of the reference memory cell is smaller than a sum of the second resistance of the MTJ memory cell and the second resistance of the first non-linear resistance device.

16. The memory device of claim 11, further comprising:
    a sense amplifier having a first input terminal and a second input terminal that are configured to receive a differential input signal, the first input terminal coupled to the MTJ memory cell and the second input terminal coupled to the reference memory cell.

17. A method for reading from an MTJ memory device, comprising:
    providing a magnetic tunnel junction (MTJ) current path and a reference current path in parallel with the MTJ current path, wherein the MTJ current path comprises an MTJ memory cell connected in series with a non-linear resistance device;
    providing a reading voltage or current to generate an MTJ current or voltage through the MTJ current path and to generate a reference current or voltage through the reference current path; and
    comparing the reference current or voltage and the MTJ current or voltage with one another to determine a data state of the MTJ memory cell.

18. The method of claim 17, wherein the data state of the MTJ memory cell is represented by a digital signal generated from a voltage detection signal based on the comparison of the reference current or voltage and the MTJ current or voltage.

19. The method of claim 17, wherein the non-linear resistance device provides a first resistance when the MTJ memory device is in a low-resistance state and a second resistance greater than the first resistance when the MTJ memory device is in a high-resistance state.

20. The method of claim 17, wherein operating points of the non-linear resistance device for a first data state and a second data state of the MTJ memory cell are chosen to be different regions on either side of a negative region of an IV characteristic curve of the non-linear resistance device.

* * * * *